(12) United States Patent
Matsuo et al.

(10) Patent No.: US 6,614,106 B2
(45) Date of Patent: Sep. 2, 2003

(54) STACKED CIRCUIT DEVICE AND METHOD FOR EVALUATING AN INTEGRATED CIRCUIT SUBSTRATE USING THE STACKED CIRCUIT DEVICE

(75) Inventors: Mie Matsuo, Kamakura (JP); Nobuo Hayasaka, Yokosuka (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 09/957,510

(22) Filed: Sep. 21, 2001

(65) Prior Publication Data

US 2002/0036340 A1 Mar. 28, 2002

(30) Foreign Application Priority Data

Sep. 27, 2000 (JP) ........................................ 2000-295230

(51) Int. Cl.[7] .............................................. H01L 23/04
(52) U.S. Cl. ...................................... 257/698; 257/621
(58) Field of Search ................................. 257/621, 698

(56) References Cited

U.S. PATENT DOCUMENTS

| | | | | |
|---|---|---|---|---|
| 4,811,082 A | * | 3/1989 | Jacobs et al. ............... | 174/261 |
| 5,177,594 A | * | 1/1993 | Chance et al. .............. | 257/678 |
| 6,137,167 A | * | 10/2000 | Ahn et al. ................. | 257/208 |
| 6,281,042 B1 | * | 8/2001 | Ahn et al. ................. | 257/723 |

FOREIGN PATENT DOCUMENTS

| | | | | |
|---|---|---|---|---|
| EP | 0 520 841 A1 | | 12/1992 | ........... H01L/21/66 |
| EP | 0 860 871 A2 | * | 8/1998 | ........... H01L/21/56 |
| JP | 10-150141 | | 6/1998 | |
| JP | 11-68157 | | 6/1999 | |
| JP | 2000183081 A | * | 6/2000 | ........... H01L/21/56 |
| JP | 2000-323701 | | 11/2000 | |

OTHER PUBLICATIONS

Mie Matsuo et al., "Silicon Interposer Technology for High-density Package", Electronic Components and Technology Conference 2000, (4 pages), May 21–24, 2000.

Mie Matsuo et al., "Integrated Circuit Dev ice and Method of Manufacturing", Ser. No. 09/605,433, filed Jun. 29, 2000.

* cited by examiner

Primary Examiner—Allan R. Wilson
(74) Attorney, Agent, or Firm—Finnegan, Henderson, Farabow, Garrett & Dunner, L.L.P.

(57) ABSTRACT

A stacked circuit device comprises a base substrate having a terminal, an interposer arranged on the base substrate and formed of a semiconductor substrate, the interposer having a first terminal connected to the terminal of the base substrate, a second terminal, and a circuit coupled to the second terminal and including an active element, and an integrated circuit chip arranged on the interposer and having a terminal connected to the second terminal.

17 Claims, 5 Drawing Sheets

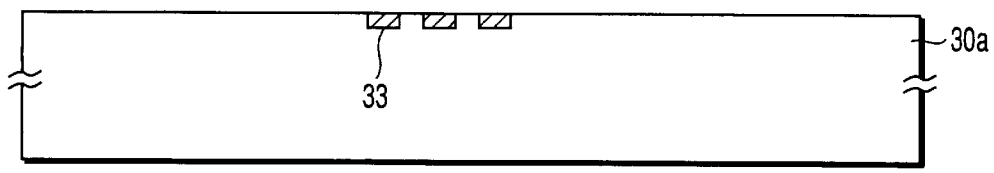
F I G. 4A
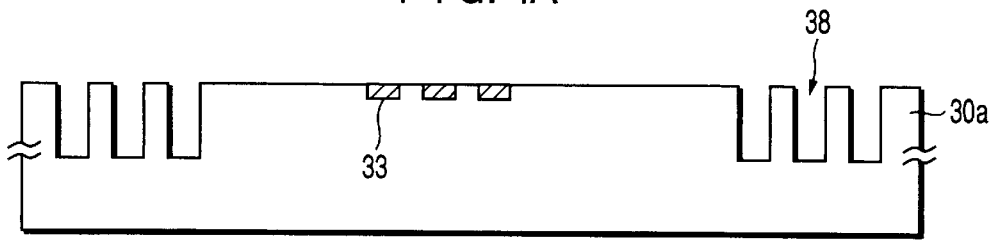
F I G. 4B
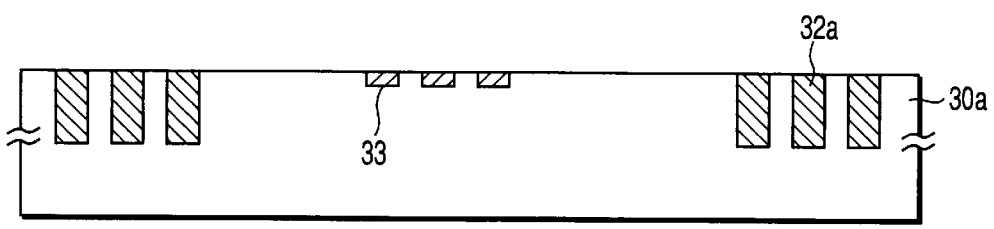
F I G. 4C
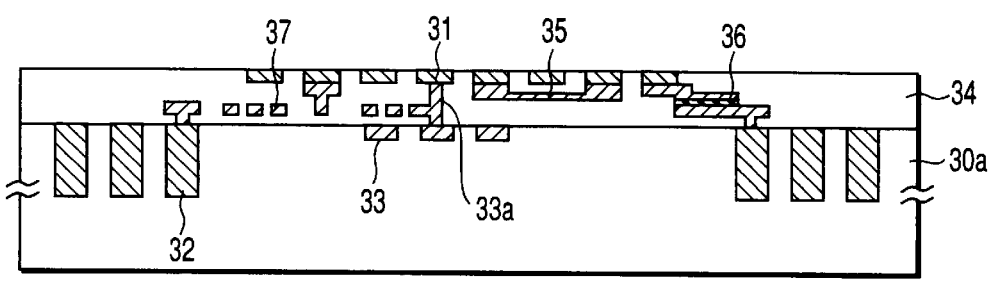
F I G. 4D
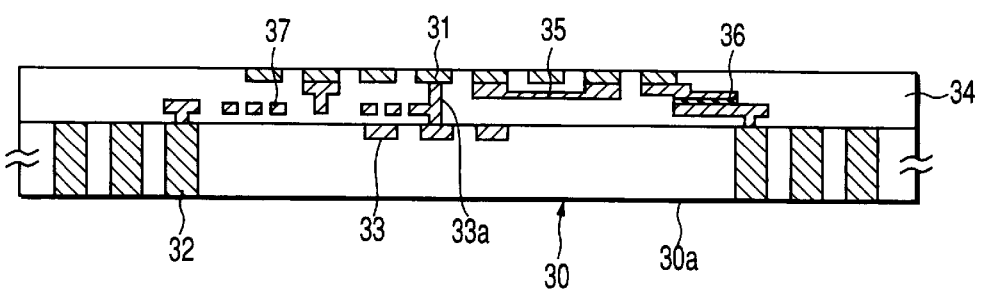
F I G. 4E

STACKED CIRCUIT DEVICE AND METHOD FOR EVALUATING AN INTEGRATED CIRCUIT SUBSTRATE USING THE STACKED CIRCUIT DEVICE

CROSS-REFERENCE TO RELATED APPLICATIONS

This application is based upon and claims the benefit of priority from the prior Japanese Patent Application No. 2000-295230, filed Sep. 27, 2000, the entire contents of which are incorporated herein by reference.

BACKGROUND OF THE INVENTION

1. Field of the Invention

The present invention relates to a stacked circuit device and method for evaluating an integrated circuit substrate using the stacked circuit device.

2. Description of the Related Art

A high-speed high integration density LSI, for example, an ASIC, presents a serious signal-delay problem resulting from an increase in chip area. For this reason, a circuit, such as a repeater, for controlling a signal delay and timing shift is provided in a chip. However, since the repeater includes active elements, such as transistors, a problem arises from an increase in chip area and a greater signal delay.

In the case where evaluation is made for the waveform and timing of a high-speed signal in the high-speed high integration density LSI, it is not easy to make lossless and accurate evaluation by setting an impedance matching between the LSI and an analyzer for evaluation because, in general, the high-speed high integration density LSI has a large number of terminals arranged in narrow pitches.

As described above, in the case where the high-speed high integration density semiconductor integrated circuit chip (LSI chip) incorporates a circuit, such as a repeater, therein, the chip area increases, and a burden on the LSI chip increases. In the case where the high-speed high integration density semiconductor integrated circuit substrate (LSI substrate) is evaluated, it has been difficult to make lossless and accurate evaluation.

BRIEF SUMMARY OF THE INVENTION

In a first aspect of the present invention, a stacked circuit device comprises a base substrate having a terminal; an interposer arranged on the base substrate and formed of a semiconductor substrate, the interposer having a first terminal connected to the terminal of the base substrate, a second terminal, and a circuit coupled to the second terminal and including an active element; and an integrated circuit chip arranged on the interposer and having a terminal connected to the second terminal.

In a second aspect of the present invention, a stacked circuit device comprises a base substrate having a terminal; and an interposer arranged on the base substrate and formed of a semiconductor substrate, the interposer having a first terminal connected to the terminal of the base substrate, a second terminal connectable to a terminal of an integrated circuit substrate as an object to be evaluated, and a circuit usable for evaluation of the integrated circuit substrate and coupled to the second terminal and including an active element.

In a third aspect of the present invention, an interposer usable for a connection between a terminal of a base substrate and a terminal of an integrated circuit chip or an integrated circuit substrate and formed of a semiconductor substrate, the interposer comprises a first terminal connectable to the terminal of the base substrate; a second terminal connectable to the terminal of the integrated circuit chip or the integrated circuit substrate; and a circuit coupled to the second terminal and including an active element.

BRIEF DESCRIPTION OF THE SEVERAL VIEWS OF THE DRAWING

FIGS. 4A to 4E are cross-sectional views showing the process of a method for manufacturing the interposer according to the first embodiment of the present invention;

DETAILED DESCRIPTION OF THE INVENTION

An explanation will be made below about the embodiments of the present invention.

First Embodiment

Figure 1:
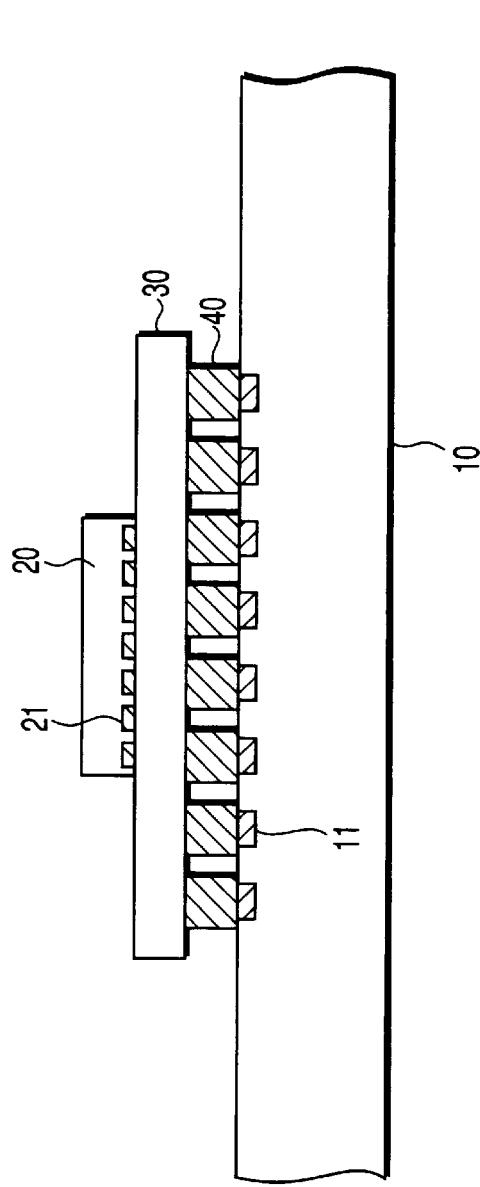
FIG. 1 is a view showing, as a model, a structure of a first embodiment of the present invention.

FIG. 1 is a view showing, as a model, a structure of a stacked circuit device according to a first embodiment of the present invention.

An interposer 30 is arranged between a base substrate 10 (mother board, etc.) and an LSI chip 20 (semiconductor integrated circuit chip) to allow a connection to be made between terminals 11 formed on a facing surface side of the base substrate 10 and terminals 21 formed on a facing surface side of the LSI chip 20. The interposer 30 is manufactured with the use of a semiconductor substrate such as a silicon substrate and has various types of circuit elements as will be set out below. The base substrate 10 and interposer 30 are connected by a conductive connection section 40 such as ball grid array.

Figure 2:
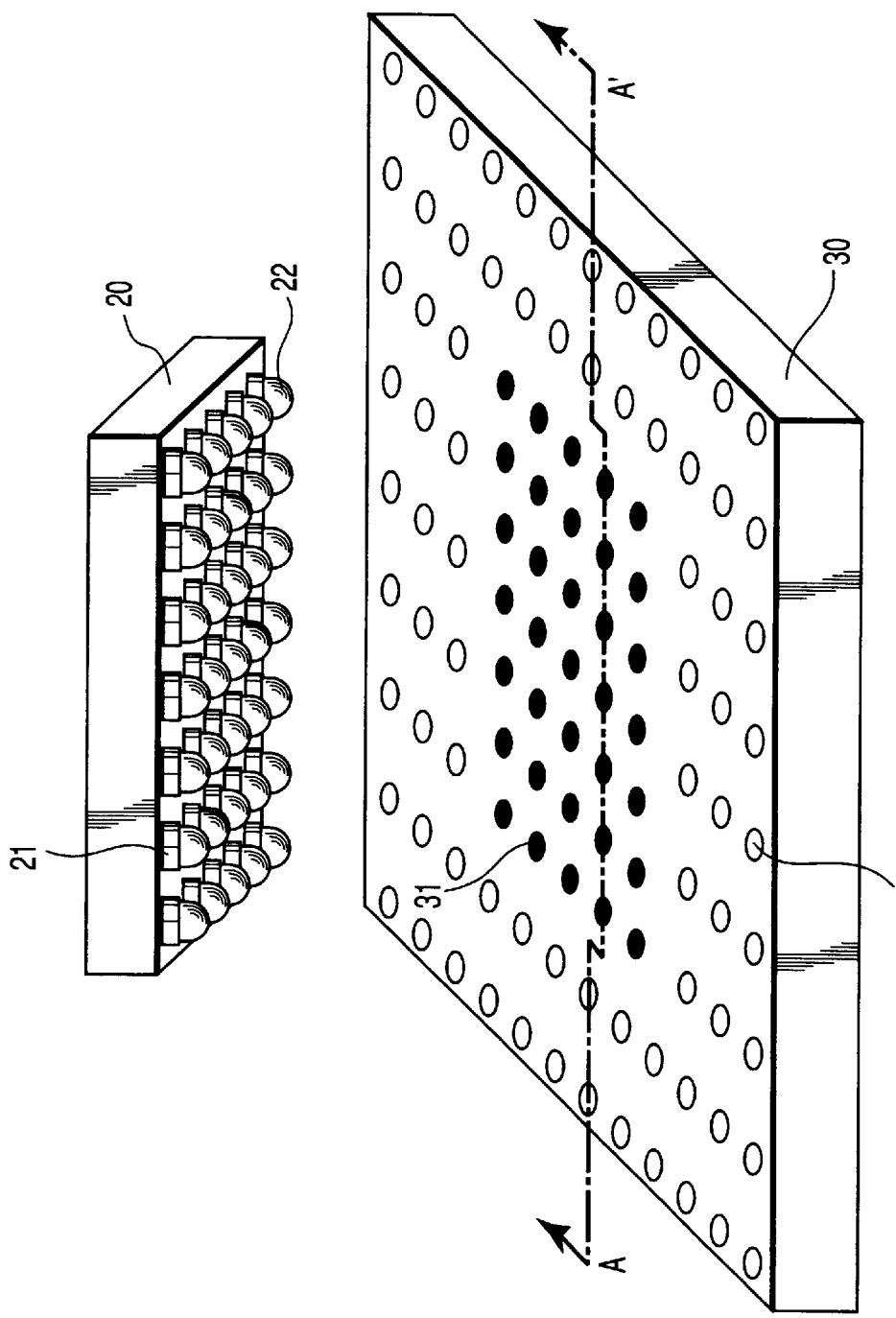
FIG. 2 is a perspective view showing an outer appearance of an interposer and LSI chip in the first embodiment of the present invention.

FIG. 2 is a perspective view showing an outer appearance of the interposer 30 and outer appearance of the LSI chip 20.

The interposer 30 has terminals 31 and conductive through plugs serving as terminals 32. The terminals 31 are formed in an area internal to an area where the terminals 32 are formed. The terminals 31 of the interposer are connected by bumps 22 to the corresponding terminals 21 of the LSI chip 20 and the terminals 32 of the interposer are connected by the conductive connection section 40 shown in FIG. 1 to the corresponding terminals 11.

Figure 3:
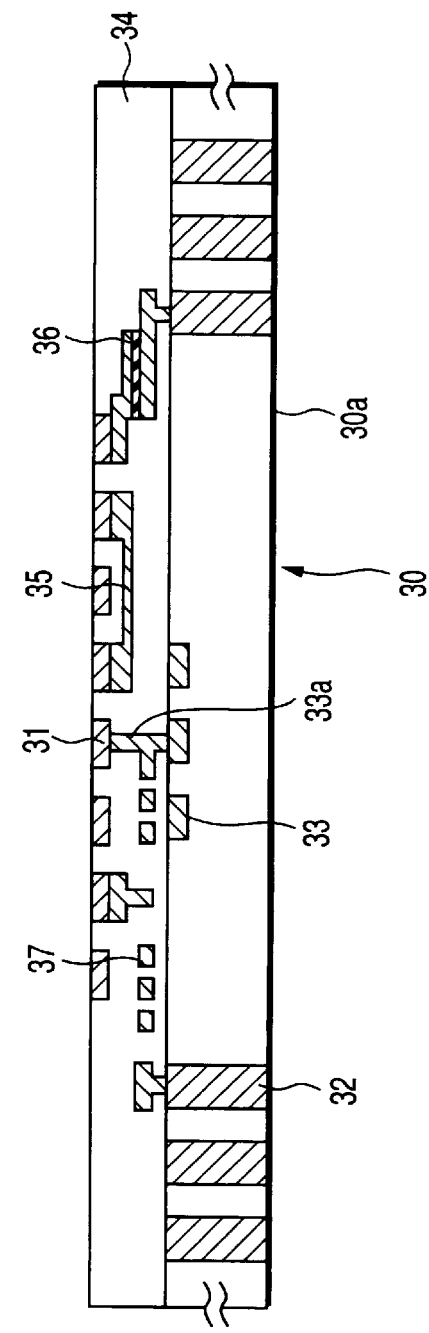
FIG. 3 is a detailed structure in cross-section of the interposer in the first embodiment of the present invention.

FIG. 3 is a detailed structure in cross-section (cross-section along line A–A' in FIG. 2) of the interposer 30.

As shown in the Figure, an insulating film 34 is formed on a semiconductor substrate body 30a. The terminals 31 are formed on the insulating film 34 in a way to be spaced from the semiconductor substrate body 30a. The terminals 32 extend through the semiconductor substrate body 30a.

Further, the interposer 30 has not only these terminals 31 and 32 but also various kinds of circuit elements. That is, a semiconductor active element 33 such as a transistor is formed in a surface region of the semiconductor substrate body 30a and the semiconductor active element 33 is connected by a connection wire 33a to the terminals 31 and 32. Further, passive elements, such as a resistive element 35, capacitive element 36 and spiral-like inductive element 37 are formed in the insulating film 34 on the semiconductor substrate body 30a. These passive elements are connected by the connection wire to the terminals 31 and 32. Further, the semiconductor active element 33, resistive element 35, capacitive element 36 and inductive element 37 are mutually connected by the connection wire.

FIGS. 4A to 4E show a manufacturing process of the interposer 30 shown in FIG. 3.

As shown in FIG. 4A, semiconductor active elements 33 are formed in a surface region of a semiconductor substrate body 30a. Then, as shown in FIG. 4B, holes 38 (30 μm in diameter×60 μm in depth) for forming through plugs are formed in the semiconductor substrate body 30a with the use of an RIE method.

Then, as shown in FIG. 4C, a silicon oxide film, not shown, is formed on the substrate surface including the holes 38 and metal films 32a are buried in the holes 38. Stated in more detail, a seed layer (Cu/TaN layer) is formed by a sputtering method and plating is effected on the seed layer to form a Cu film with which the hole 38 is buried. After this, any excessive metal film is eliminated by means of a CMP method to selectively leave metal films 32a in the holes 38.

Then, as shown in FIG. 4D, an insulating film (silicon nitride film) 34 is formed by means of a PE-CVD method and a resistive element 35, capacitive element 36, inductive element 37, connection wire 33a and terminal 31 are formed. In the process of forming the above-mentioned respective elements, not only the insulating film 34 but also one or more insulating films may be formed.

After this, as shown in FIG. 4E, the semiconductor substrate body 30a is ground from a back side by a grinding and CMP process to expose the metal film for forming a through plug 32. By doing so, an interposer 30 is manufactured as shown in FIG. 3.

As set out above, the interposer 30 has various circuit elements and, with the use of these circuit elements, it is possible to construct a repeater circuit, booster circuit, etc. The repeater circuit and booster circuit act as auxiliary circuits relative to a circuit in the LSI chip 20. As is evident from the above, since the repeater circuit, etc., is incorporated into the interposer 30, it is not necessary to provide, for example, a repeater circuit in the LSI chip 20. Therefore, the area per LSI chip is reduced and hence the burden on the LSI chip is alleviated and a signal delay, etc., in the LSI chip is reduced.

Further, the terminals 31 are formed in a central area of the interposer and the terminals 32 (through plugs) are formed in an area external to the area of the terminals 31. The semiconductor active elements 33 are formed in the central area of the interposer. Therefore, the semiconductor active elements 33 and terminals 32 (through plugs) are formed in different areas and, in the manufacture, etc., of the interposer, the semiconductor active elements 33 are not adversely affected by the terminals 32.

Second Embodiment

Figure 5:
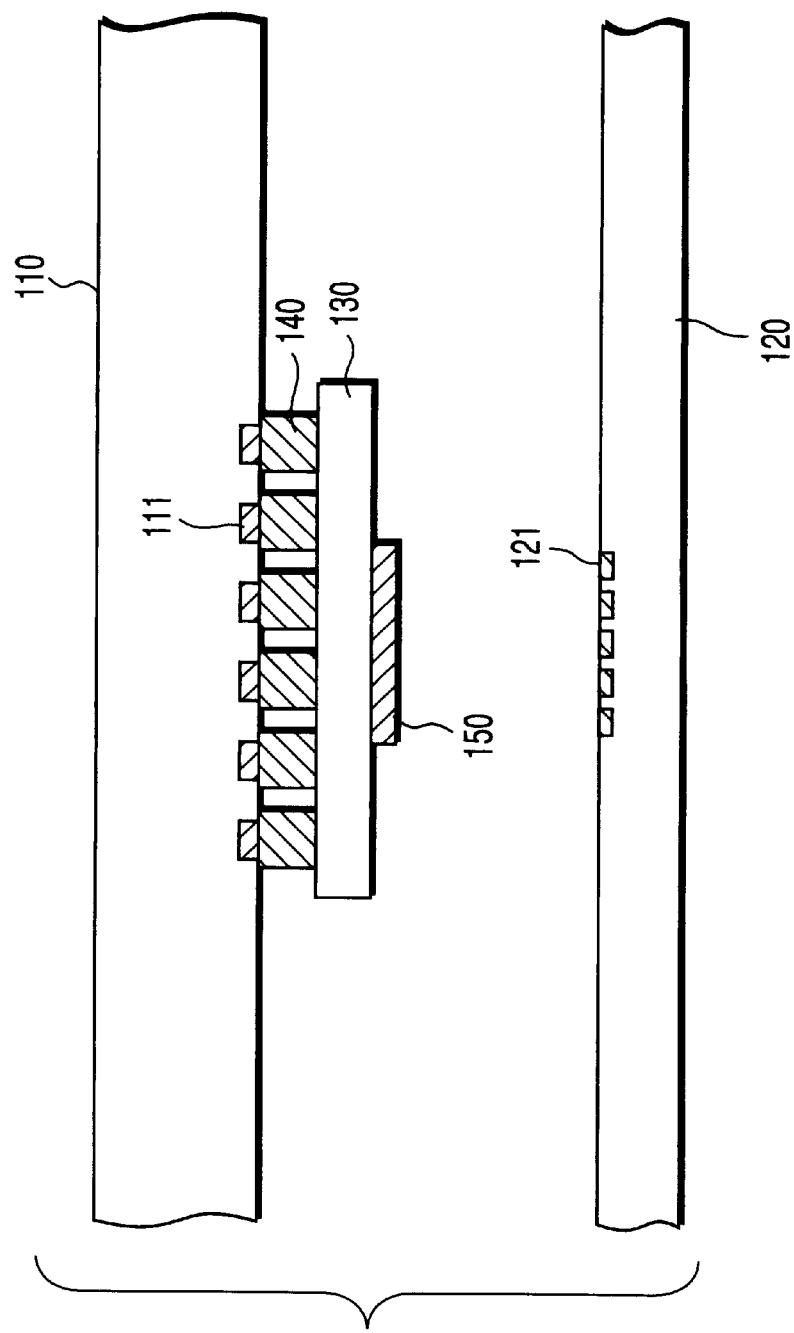
FIG. 5 is a view showing, as a model, a structure according to a second embodiment of the present invention.

FIG. 5 is a view showing, as a model, a structure of a stacked circuit device according to a second embodiment of the present invention.

The stacked circuit device of the present embodiment evaluates (measures) an LSI wafer 120 (a semiconductor integrated circuit substrate) with a plurality of LSIs. An interposer 130 has a circuit for LSI evaluation and, to a base substrate 110, an external evaluation apparatus, not shown, is connected.

The interposer 130 is arranged to allow a connection to be made between terminals 111 of the base substrate 110 and terminals 121 of the LSI wafer 120. The interposer 130 is manufactured with the use of a semiconductor substrate such as a silicon substrate and includes various kinds of circuit elements as will be set out below. The base substrate 110 and interposer 130 are connected to each other by a conductive connection section 140 such as a BGA. An anisotropically conductive contactor 150 is arranged on a surface side facing the LSI wafer 120 to be electrically connected to the LSI wafer 120.

Figure 6:
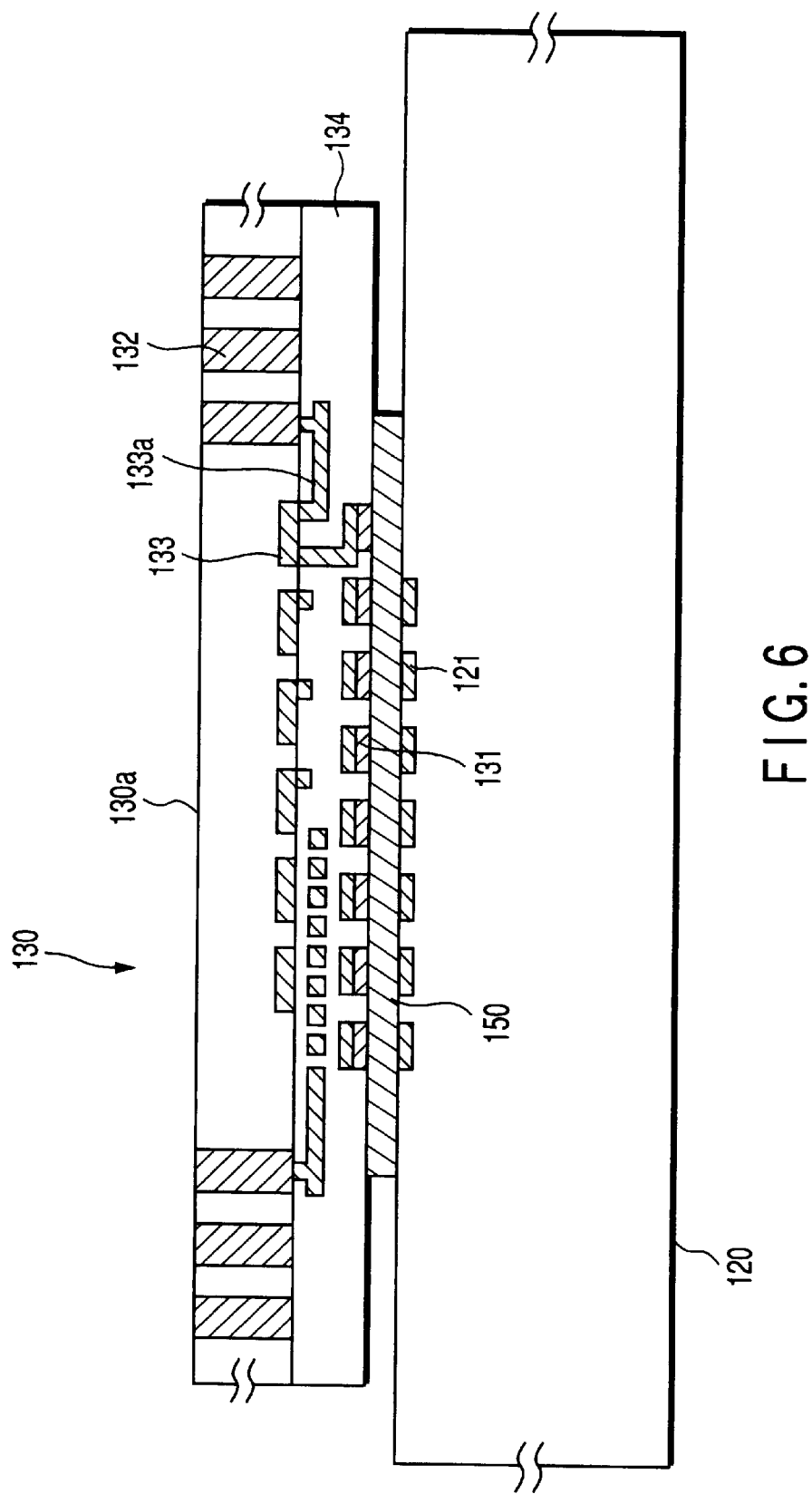
FIG. 6 shows a detailed structure in cross-section of an interposer, etc., in the second embodiment of the present invention.

FIG. 6 is a view showing a state connected between the interposer 130 and the LSI wafer 120 so as to evaluate the LSI wafer 120.

The interposer 130 has terminals 131 and conductive through plugs acting as terminals 132. The terminals 131 are formed in an area internal to an area where the terminals 132 are formed, noting that the planar layout of the terminals 131 and terminals 132 is the same as that of the terminals in FIG. 2. The terminals 131 are formed on an insulating film 134 in a manner spaced apart from a semiconductor substrate body 130a. The terminals 132 extend through the semiconductor substrate body 130a. Further, the terminals 132 are connected to the terminals 111 of the base substrate 110 by the conductive connection section 140 shown in FIG. 5. Upon the evaluation of circuits in the LSI wafer 120, the terminals 131 are connected through the contactor 150 to the terminals 121 of the LSI wafer 120.

The interposer 130 includes various kinds of circuit elements. That is, a circuit 133 comprised of semiconductor active elements such as transistors is formed in the semiconductor substrate body 130a and the circuit 133 is connected to the terminals 131 and 132 by a connection wire 133a formed in the insulating film 134. It may be possible to form not only the semiconductor active elements but also passive elements, such as a resistive element, capacitive element, inductive element, in the circuit 133. It is to be noted that the basic manufacturing method of the interposer 130 is the same as that set out above in connection with the first embodiment.

The circuit 133 functions as an evaluation circuit for evaluating a circuit formed in the LSI wafer 120. The evaluation circuit includes circuits, for example, a signal generator circuit, frequency measuring circuit, oscillator circuit, etc. Since the interposer 130 incorporates the evaluation circuit 133, part of the evaluation function can be possessed by the circuit 133 in the interposer 130 and it is possible to easily, losslessly and accurately evaluate the LSI for the waveform and timing of high speed signals.

Further in the second embodiment, the basic layout of the terminals 131, terminals 132 (through plugs) and semiconductor active elements is the same as in the first embodiment and, as in the first embodiment, the semiconductor active element is not adversely affected by the terminals 132 upon the manufacture, etc., of the interposer.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A stacked circuit device comprising:

a base substrate having terminal;

an interposer arranged on the base substrate and formed of a semiconductor substrate, the interposer having a first terminal connected to the terminal of the base substrate and arranged in a first area, a second terminal arranged in a second area provided on an inside of the first area in a direction parallel to a main surface of the interposer, and a circuit coupled to the second terminal and including an active element; and an integrated circuit chip arranged on the interposer and having a terminal connected to the second terminal.

2. A stacked circuit device according to claim 1, wherein the circuit including the active element is comprised of at least one of a repeater circuit and a booster circuit.

3. A stacked circuit device according to claim 1, wherein the circuit including the active element is arranged in the second area.

4. A stacked circuit device according to claim 1, wherein the first terminal extends through a body of the semiconductor substrate and the second terminal is spaced away from the body of the semiconductor substrate.

5. A stacked circuit device comprising:

a base substrate having a terminal; and an interposer arranged on the base substrate and formed of a semiconductor substrate, the interposer having a first terminal connected to the terminal of the base substrate, a second terminal connectable to a terminal of an integrated circuit substrate as an object to be evaluated, and a circuit configured to evaluate the integrated circuit substrate and coupled to the second terminal and including an active element, wherein the interposer has a first area and a second area provided on an inside of the first area in a direction parallel to a main surface of the interposer, and the first terminal is arranged in the first area and the second terminal is arranged in the second area.

6. A stacked circuit device according to claim 5, wherein the circuit including the active element is comprised of at least one of a signal generator circuit, a frequency measuring circuit, and an oscillator circuit.

7. A stacked circuit device according to claim 5, wherein the circuit including the active element is arranged in the second area.

8. A stacked circuit device according to claim 5, wherein the first terminal extends through a body of the semiconductor substrate and the second terminal is spaced away from the body of the semiconductor substrate.

9. A stacked circuit device according to claim 5, further comprising a contactor connected to the second terminal and contactable with the terminal of the integrated circuit substrate.

10. A method for evaluating an integrated circuit substrate using the stacked circuit device according to claim 5, comprising:

connecting the second terminal to the terminal of the integrated circuit substrate; and evaluating the integrated circuit substrate by using the circuit including the active element.

11. An interposer usable for a connection between a terminal of a base substrate and a terminal of an integrated circuit chip or an integrated circuit substrate and formed of a semiconductor substrate, the interposer comprising:

a first terminal connectable to the terminal of the base substrate and arranged in a first area;

a second terminal connectable to the terminal of the integrated circuit chip or the integrated circuit substrate and arranged in a second area provided on an inside of the first area in a direction parallel to a main surface of the interposer; and a circuit coupled to the second terminal and including an active element.

12. An interposer according to claim 11, wherein the circuit including the active element is comprised of at least one of a repeater circuit and a booster circuit.

13. An interposer according to claim 11, wherein the circuit including the active element is comprised of at least one of a signal generator circuit, a frequency measuring circuit and an oscillator circuit which are usable for evaluation of the integrated circuit substrate.

14. An interposer according to claim 11, wherein the circuit including the active element is arranged in the second area.

15. An interposer according to claim 11, wherein the first terminal extends through a body of the semiconductor substrate and the second terminal is spaced away from the body of the semiconductor substrate.

16. An interposer according to claim 11, further comprising a wire included in an area arranged on a body of the semiconductor substrate, the wire achieving a coupling between the second terminal and the circuit including the active element.

17. An interposer according to claim 16, wherein the area including the wire further includes a passive element.

* * * * *

UNITED STATES PATENT AND TRADEMARK OFFICE
CERTIFICATE OF CORRECTION

PATENT NO.   : 6,614,106 B2
DATED        : September 2, 2003
INVENTOR(S)  : Matsuo et al.

It is certified that error appears in the above-identified patent and that said Letters Patent is hereby corrected as shown below:

Column 5,
Line 6, change "having terminal;" to -- having a terminal --.

Signed and Sealed this

Eleventh Day of November, 2003

JAMES E. ROGAN
*Director of the United States Patent and Trademark Office*